US 9,536,845 B2

(12) United States Patent
Lamy et al.

(10) Patent No.: US 9,536,845 B2
(45) Date of Patent: Jan. 3, 2017

(54) DEVICE FOR RADIOFREQUENCY (RF) TRANSMISSION WITH AN INTEGRATED ELECTROMAGNETIC WAVE REFLECTOR

(71) Applicant: Commissariat a L'Energie Atomique et aux Energies Alternatives, Paris (FR)

(72) Inventors: Yann Lamy, Saint Etienne de Crossey (FR); Laurent Dussopt, Grenoble (FR); Ossama El Bouayadi, Grenoble (FR); Amazir Moknache, Grenoble (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 0 days.

(21) Appl. No.: 15/040,354

(22) Filed: Feb. 10, 2016

(65) Prior Publication Data
US 2016/0233178 A1 Aug. 11, 2016

(30) Foreign Application Priority Data

Feb. 11, 2015 (FR) ...................... 15 51121

(51) Int. Cl.
*H01L 23/66* (2006.01)
*H01L 21/48* (2006.01)
(Continued)

(52) U.S. Cl.
CPC ........... *H01L 23/66* (2013.01); *H01L 21/4846* (2013.01); *H01L 23/367* (2013.01); *H01L 23/498* (2013.01);
(Continued)

(58) Field of Classification Search
CPC .... H01L 23/66; H01L 21/4846; H01L 23/367; H01L 23/552; H01L 23/49827; H01L 25/0655; H01L 23/49833; H01L 25/50; H01L 2223/6677; H01L 2223/6616
See application file for complete search history.

(56) References Cited

U.S. PATENT DOCUMENTS 6,262,495 B1  7/2001 Yablonovitch et al.
6,483,481 B1  11/2002 Sievenpiper et al.
(Continued)

FOREIGN PATENT DOCUMENTS

DE  10 2012 107 803 A1  2/2013
DE  10 2013 111 569 A1  4/2014
(Continued)

OTHER PUBLICATIONS

French Preliminary Search Report issued Jan. 7, 2016 in French Application 15 51121, filed Feb. 11, 2015 (with English Translation of Categories of Cited Documents).
(Continued)

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

RF transmission device including at least:
  a substrate comprising first and second faces opposite to each other;
  a first RF transmission electronic circuit arranged on and/or in the substrate;
  a first antenna arranged on the side of the first face of the substrate, spaced apart from the first face of the substrate and electrically connected to the first RF transmission electronic circuit;
  a first electromagnetic wave reflector coupled to the first antenna and including:
    a first high impedance surface comprising at least several first electrically conducting elements form-
(Continued)

ing a first periodic structure and arranged on the first face of the substrate opposite the first antenna;

a first electrically conducting ground plane arranged at least partially opposite the first antenna.

20 Claims, 3 Drawing Sheets

(51) Int. Cl.
| | |
|---|---|
| H01L 23/367 | (2006.01) |
| H01L 23/498 | (2006.01) |
| H01L 23/552 | (2006.01) |
| H01L 25/065 | (2006.01) |
| H01L 25/00 | (2006.01) |
| H01L 23/538 | (2006.01) |
| H01P 1/20 | (2006.01) |
| H01Q 15/00 | (2006.01) |
| H01L 23/00 | (2006.01) |

(52) U.S. Cl.
CPC ... *H01L 23/49827* (2013.01); *H01L 23/49833* (2013.01); *H01L 23/5389* (2013.01); *H01L 23/552* (2013.01); *H01L 25/0655* (2013.01); *H01L 25/50* (2013.01); *H01P 1/20* (2013.01); *H01Q 15/008* (2013.01); *H01L 23/3677* (2013.01); *H01L 23/49816* (2013.01); *H01L 24/19* (2013.01); *H01L 2223/6616* (2013.01); *H01L 2223/6677* (2013.01); *H01L 2224/04105* (2013.01); *H01L 2224/73267* (2013.01); *H01L 2924/15313* (2013.01)

(56) References Cited

U.S. PATENT DOCUMENTS

| | | |
|---|---|---|
| 2009/0256752 A1 | 10/2009 | Akkermans et al. |
| 2011/0163457 A1 | 7/2011 | Mohan et al. |
| 2011/0170268 A1 | 7/2011 | Takemura et al. |
| 2012/0104574 A1 | 5/2012 | Boeck et al. |
| 2012/0119969 A1* | 5/2012 | MacDonald .......... H01L 23/552 343/841 |
| 2013/0161828 A1 | 6/2013 | Lamy |

FOREIGN PATENT DOCUMENTS

| | | |
|---|---|---|
| DE | 10 2013 102 781 A1 | 6/2014 |
| JP | 2002-510886 | 4/2002 |
| JP | 2005-538629 | 12/2005 |
| WO | WO 99/50929 A1 | 10/1999 |
| WO | WO 2004/025783 A1 | 3/2004 |

OTHER PUBLICATIONS

Daniel Frederic Sievenpiper "High-Impedance Electromagnetic Surfaces", A Dissertation Submitted in Partial Satisfaction of the Requirements for the Degree of Doctor of Philosophy in Electrical Engineering, Jan. 1, 1999, 161 pages.

D. Sievenpiper et al. "Antennas on High-Impedance Ground Planes", Microwave Symposium Digest, 1999 IEEE MTT-S International, Jun. 13-19, 1999, 4 pages.

Dong Gun Kam et al. "Low-Cost Antenna-in-Package Solutions for 60-GHz Phased-Array Systems", IEEE Electrical Performance of Electronic Packages and Systems Conference (EPEPS), Oct. 2010, 4 pages.

M. Wojnowski et al. "A 77-GHz SiGe Single-Chip Four-Channel Transceiver Module with Integrated Antennas in Embedded Water-Level BGA Package", IEEE Electronic Components and Technology Conference (ECTC), Jun. 2012, 6 pages.

Y. Lamy et al. "A Compact 3D Silicon Interposer Package with Integrated Antenna for 60GHz Wireless Applications", published in 3D Systems Integration Conference (3DIC), 2013 IEEE International, Oct. 2-4, 2013, 6 pages.

* cited by examiner

DEVICE FOR RADIOFREQUENCY (RF) TRANSMISSION WITH AN INTEGRATED ELECTROMAGNETIC WAVE REFLECTOR

TECHNICAL FIELD AND PRIOR ART

The invention relates to a radiofrequency (RF) transmission device comprising at least one RF transmission electronic circuit coupled to at least one integrated electromagnetic wave reflector enabling the formation of the device with low thickness, high gain and good efficiency. The invention may apply notably to the field of RF transmission for frequencies which can range from around 1 GHz to around 300 GHz, and advantageously between around 30 GHz and 250 GHz.

In the field of RF transmission devices, the integration and the packaging of RF components, also called RFIC chips or RF transmission electronic circuits, and their antennas are becoming more and more important in terms of bulk, electrical performances, heat dissipation and cost. In particular, the connections of RF electronic components to antennas become particularly critical in terms of losses (the interconnections and the antennas generally account for around half of the overall performances of the transmission devices), which is all the more true as the frequencies and their number increase, as is the case in numerous forthcoming applications intended to operate at frequencies comprised between 30 GHz and 250 GHz. Thus, with the emergence of microwave and millimetric communications for nomadic devices (phones, tablets, portable PCs, connected objects, etc.), it is more and more important to miniaturize and improve the performances of the packaging including the RF transmitter (transmitter-receiver, or "transceiver") chip or component and antennas, and to do so at low cost for general public applications.

A first category of packaging of RFIC chips and their antennas is based on multilayer technologies obtained by lamination of organic and metallic layers. In this type of device, as for example described in the documents US 2009/0256752 A1 and "Low-Cost Antenna-in-Package Solutions for 60-GHz Phased-Array Systems" of D. G. Kam et al., IEEE Electrical Performance of Electronic Packages and Systems Conference (EPEPS), October 2010, pp. 93-96, cavities are provided to receive and interconnect the RFIC chip on the one hand and for producing reflective, or resonant, cavities for the antennas on the other hand.

These devices nevertheless have several drawbacks:
they are complex to form because they bring into play a large number of layers. They are especially suited to be produced via PCB (printed circuit board) manufacturing techniques, but said techniques are limited in terms of the resolutions of routing lines and vertical interconnections which can be obtained, which is highly penalizing for high frequency transmissions (for example above 60 GHz). Furthermore, the positioning precisions which can be obtained are also mediocre (generally above 500 μm),
they are bulky, especially in terms of thickness because the cavities of the antennas are superimposed on the cavity of the chip,
they only enable the use of a single frequency band for which the antennas are optimized,
the rear face of the chip is not or is very little in contact with the packaging which is itself made of organic material which is a poor heat conductor. This has the consequence that very little heat is dissipated from the RFIC chip which heats up more and more, especially when the frequencies increase.

Another variant of packaging of RFIC, chips and antennas is based on fan-out type integration, also called eWLB (embedded die Wafer Level BGA). In this type of device, as for example described in the documents US 2012/0104574 A1 and "A 77-GHz SiGe Single-Chip Four-Channel Transceiver Module with Integrated Antennas in Embedded Wafer-Level BGA Package" of M. Wojnowski et al., IEEE Electronic Components and Technology Conference (ECTC), June 2012, pp. 1027-1032, the chip is coated, active face downwards, with a polymer material (typically epoxy) on which are reconstructed an electric routing circuit, the antennas and the pads for the solder beads. The reflective plane of the antennas is arranged on the transfer PCB, and the antennas radiate upwards.

This type of device has the advantage of having a low production cost and generates relatively few high frequency losses on account of the plastic substrate and/or the coated material used. However, it necessitates having a reflector arranged on the PCB transfer substrate, which limits the routing density which can be obtained on the PCB. Furthermore, this type of structure implies eliminating the connection beads under the antennas, which considerably reduces the mechanical reliability of the structure. Moreover, the performances of the antennas depend in a critical manner on the height of the beads after assembly which must be equal to $\lambda_g/4$ ($\lambda_g$ being the transmission wavelength in the propagation medium), and makes it possible to form antennas centered uniquely on a single frequency. Finally, the RFIC chip is immersed in a material that conducts heat very poorly, which considerably adversely affects heat dissipation.

A third type of packaging of RFIC chips with integrated antennas is described in the document "A compact 3D silicon interposer package with integrated antenna for 60 GHz wireless applications" of Y. Lamy et al., IEEE 3D Systems Integration Conference (3DIC), October 2013, pp. 1-6. Such a device is based on a silicon substrate on which are manufactured the antennas and on which is transferred the RFIC chip.

Despite a possible advantage in terms of resolution of patterns which can be obtained, this solution also suffers from a certain number of drawbacks:
a reflective plane is necessarily arranged on the PCB, which implies design constraints and losses of space for the routing;
connection beads are absent at the reflector, which reduces the reliability of the beading and thus the mechanical integrity of the assembly;
the height of the beads has a very important impact on the structure obtained after assembly, and thus also on the properties of the antennas;
a single height is possible at the antennas, which implies a single possible transmission frequency band for the device;
the heat dissipation of the RFIC chip is insufficient.

Generally speaking, these different RF transmission devices suffer from an important bulk due to the cavities or to the distance that has to be maintained between the reflective planes and the antennas. If the reflective planes are brought closer together to gain in compactness, the performances of the antennas then drop drastically (drop in the radiation efficiency and consequently the gain realized).

DESCRIPTION OF THE INVENTION

There thus exists a need to propose an RF transmission device not having the drawbacks of devices of the prior art, i.e. the structure of which can be produced by conventional microelectronics methods with a low cost, which is not very bulky while being high performance and compatible with a transmission according to different frequency bands, which has a good mechanical integrity and which dissipates the heat produced therein.

For this purpose, an RF transmission device is described including at least:
- a substrate comprising first and second faces opposite to each other;
- a first RF transmission electronic circuit arranged on and/or in the substrate;
- a first antenna arranged on the side of the first face of the substrate, spaced apart from the first face of the substrate and electrically connected to the first RF transmission electronic circuit;
- a first electromagnetic wave reflector coupled to the first antenna and including at least:
  - a first high impedance surface comprising at least several first electrically conducting elements forming a first periodic structure and arranged on the first face of the substrate opposite the first antenna;
  - a first electrically conducting ground plane arranged at least partially opposite the first antenna.

Such a device forms a miniaturized package of one or more RF transmission electronic circuits, or RF transmitters, comprising one or more integrated antennas which can have low thickness, high gain and high efficiency thanks to the coupling of the antenna(s) with one or more electromagnetic wave reflectors including one or more high impedance surfaces coupled to one or more electrically conducting ground planes.

This integration of RF transmission electronic circuit(s) offers multiple advantages, notably in the domain of frequencies ranging from around 1 GHz to around 300 GHz.

Firstly, such a device makes it possible, thanks to the electromagnetic wave reflector including a high impedance surface, to eliminate the reflective cavity coupled to the antenna and which is necessary in devices of the prior art, or to modify it by reducing it very considerably for example by a factor comprised between around 10 and 100, while maintaining, or even improving, the transmission properties of the antenna. The association of the high impedance surface and the ground plane forms an electromagnetic wave reflector which advantageously replaces a conventional metallic reflective plane coupled to a reflective cavity of height, or thickness, equal to $\lambda/4$ (which corresponds to a height, or thickness, of 1.25 mm for a frequency of transmission in air equal to 60 GHz), while reducing the thickness, or the height, necessary for its production (which may be less than or equal to $\lambda/10$, i.e. a thickness, or height, less than or equal to 500 µm), which means the device can be integrated in electronic cards suited for mobile phones or touch tablets. Furthermore, the high impedance surface shields, or masks, to a large extent the substrate which may thus be formed from materials of less good quality in terms of dielectric losses, such as for example standard silicon, without impacting the performances of the device.

Said device also makes it possible to eliminate the dependence of the respective thicknesses of the RF transmission electronic circuit and/or of the substrate compared to the resonance wavelength of the antenna, due to the fact that the design of the high impedance surface (choice of materials used, dimensions and shapes of electrically conducting elements, etc.) makes it possible to optimize the performances of the antennas without imposing strict conditions of thicknesses either on the RF transmission electronic circuit, or on the substrate.

Due to the fact that no reflective cavity is present at the second face, or rear face, of the substrate, said face is entirely available to form thereon the multilayer electrical routing but also means of mechanically maintaining the substrate, for example solder beads, thereby increasing the reliability of the assembly formed. This free face of the substrate also makes it possible to have freely available interconnections of the package at the level thereof.

The RF transmission electronic circuit being arranged on or in the substrate, this structure makes it possible to optimize the heat dissipation of the RF transmission electronic circuit notably via its rear face which may be in contact with the substrate over its whole surface. This configuration makes it possible to carry out a transfer of the electronic circuit in direct contact with the substrate which is preferentially a good heat conductor, for example made of silicon (the heat dissipation coefficient of which is 150 W/(K·m)).

Said device also makes it possible to co-integrate in a same package, with a same technology and a same thickness of substrate, several high performance antennas operating at different frequencies or different frequency bands, due to the fact that the optimization of the transmission of an antenna may be achieved thanks to the design of the high impedance surface for each frequency and not by the specific thicknesses of the substrate or a reflective cavity coupled to said antenna.

Said device may moreover be produced via the implementation of conventional microelectronic steps (deposition, photolithography, etc.), without having to implement numerous complex steps of lamination of layers.

In this device, the first antenna and the first high impedance surface are arranged on the same side of the substrate (at the first face of the substrate) on the side of the front face of the device. This configuration is advantageous because the first antenna and the first high impedance surface may be formed during common production steps, for example steps of photolithography and etching implemented for a single face of the device. It is thus not necessary to implement separate steps for the formation of these two elements of the device, which necessitates a front face/rear face alignment which is difficult to achieve, and which demands in certain cases, for example when the substrate comprises silicon, the use of an additional optical or infrared camera system on the lithography equipment.

The arrangement of the first antenna and the first high impedance surface on the same side of the substrate is also advantageous because it does not impose any constraint for the choice of the thickness and the nature of the material, for example dielectric, located between these two elements. Thus, if the first high impedance surface was arranged on the side of the rear face of the substrate, the distance between the first antenna and the first high impedance surface would be imposed by the thickness of the chip, notably of the substrate, which is often poorly controlled, which would be an additional constraint in the design of the first antenna and the first high impedance surface.

Moreover, due to the fact that the first electrically conducting elements of the first high impedance surface are arranged on the first face of the substrate opposite the first antenna, the first high impedance surface also makes it possible to achieve shielding of the first antenna with respect to the substrate, preventing secondary radiation from passing through the substrate. This makes it possible to reduce dissipation compared to a conventional device with quarter-wave reflector, especially in the case of a substrate comprising a dissipating material such as silicon.

A transmission device, or transceiver, is a device which can transmit and/or receive waves.

The substrate may correspond to a monolithic (monolayer) support or a substrate formed of several assembled layers and/or supports.

A high impedance structure may correspond to as metal-dielectric structure, generally comprising elementary cells arranged in a periodic manner and the period of which is negligible in view of the wavelength at the frequency of interest. It is characterized by its resonance frequency $f_0$ at which a flat wave in normal incidence is totally reflected with a zero phase (reflection coefficient of amplitude 1 and phase 0). At this frequency, the output impedance has, theoretically, an infinite real part (resistance) and a zero imaginary part (reactance). In practice, high impedance behavior is considered when the phase of the reflection coefficient is comprised between around [−45°; 45°].

Advantageously, the first RF transmission electronic circuit may be arranged at, or on, the first face of the substrate. The first RF transmission electronic circuit may nevertheless be arranged on, or at, one or the other of the first and second faces of the substrate.

The first electrically conducting ground plane may be arranged on, or at, the second face of the substrate. In a variant, the first electrically conducting ground plane could be arranged on another support than the second face of the substrate, said support being able to be located on the side of the second face of the substrate. Thus, the first electrically conducting ground plane may be arranged at the rear face of the device. The thickness of the substrate is thus used to form the space between the first high impedance surface and the first electrically conducting ground plane, which makes it possible to reduce even further the bulk of the device.

The device may further comprise a first dielectric layer arranged on the first face of the substrate, surrounding the first RF transmission electronic circuit and on which the first antenna is arranged. A part of this first dielectric layer may also cover the first RF transmission electronic circuit.

In a variant of this first dielectric layer, the device may further comprise a cavity delimited by the first high impedance surface and by a suspended membrane on which at least the first antenna is arranged.

A distance between the first antenna and the first electrically conducting ground plane may be less than or equal to around a tenth of a central wavelength of first RF signals intended to be transmitted and/or received by the first antenna. The central wavelength of first RF signals intended to be transmitted and/or received by the first antenna corresponds to a central frequency situated in a frequency band for which the gain and the adaptation of the antenna are optimal. Said central frequency may correspond to that for which the gain is maximal. Such a configuration confers very good compactness to the device.

Each first electrically conducting element of the first high impedance surface may comprise one or more flat conducting portions, for example metallic, arranged beside each other and/or in different planes superimposed on each other, the first high impedance surface being able to further comprise a second dielectric layer in which are arranged the first electrically conducting elements.

In this case, each first electrically conducting element of the first high impedance surface may further comprise at least one vertical conducting portion, for example metallic, connected to the or at least one of the flat conducting portions of said first electrically conducting element.

The device may further comprise:
  several first electrically conducting vias crossing through at least the substrate and electrically connected to the first RF transmission electronic circuit, and/or
  several second electrically conducting vias crossing through at least the substrate and arranged around the first antenna while forming a guard ring around the first antenna, and/or
  several third heat conducting vias crossing through at least the substrate and arranged under the first RF transmission circuit.

The first electrically conducting vias serve in this case for input and/or output electrical connections connected to the first RF transmission electronic circuit. These first vias may be electrically connected to a printed circuit to which the substrate is joined.

The second electrically conducting vias form a guard ring around the first antenna which makes it possible to isolate, from the electromagnetic viewpoint, the first antenna vis-à-vis other elements, such as for example other antennas and thereby considerably reduce cross talk between them.

The third heat conducting vias which are arranged under the first RF transmission circuit participate actively in the dissipation of heat generated by said circuit thanks to the high thermal conductivity of said third vias. This is particularly the case when the material of the third vias is metallic, for example copper, which is an excellent heat and electrical conductor.

The third electrically conducting vias may be electrically conducting. Thus, these third vias can make it possible to form an electrical routing.

The device may further comprise at least:
  a second antenna arranged on the side of the first face of the substrate, spaced apart from the first face of the substrate and electrically connected to the first RF transmission electronic circuit;
  a second electromagnetic wave reflector coupled to the second antenna and including at least:
    a second high impedance surface comprising at least several second electrically conducting elements forming a second periodic structure and arranged on the first face of the substrate opposite the second antenna;
    a second electrically conducting ground plane arranged at least partially opposite the second antenna.

In this case, the aforementioned advantages relative to the arrangement of the first antenna and the first high impedance surface on the same side of the substrate, and the arrangement of the first electrically conducting elements of the first high impedance surface on the first face of the substrate opposite the first antenna, also apply for the second antenna and the second high impedance surface.

The device may thus comprise several antennas being able to carry out transmissions of RF signals at different frequencies or frequency bands. Such a configuration is for example advantageous in the case of the roll out of future 5G systems which are going to call upon several types of millimetric frequencies: for example 60 GHz for the cellular network and 80 GHz for "backhauling" or point to point connection.

In a variant, the device may further comprise at least:
  a second RF transmission electronic circuit arranged on and/or in the substrate;
  a second antenna arranged on the side of the first face of the substrate, spaced apart from the first face of the substrate and electrically connected to the second RF transmission electronic circuit;
a second electromagnetic wave reflector coupled to the second antenna and including at least:
    a second high impedance surface comprising at least several second electrically conducting elements forming a second periodic structure and arranged on the first face of the substrate opposite the second antenna;
    a second electrically conducting ground plane arranged at least partially opposite the second antenna.

Here again, the advantages described previously relative to the arrangement of the first antenna and the first high impedance surface on the same side of the substrate, and the arrangement of the first electrically conducting elements of the first high impedance surface on the first face of the substrate opposite the first antenna, also apply for the second antenna and the second high impedance surface.

Here again, the device may thus realize transmissions of signals at different frequencies as explained above.

The second RF transmission electronic circuit is advantageously arranged at, or on, the first face of the substrate, but it may be arranged independently on, or at, one or the other of the first and second faces of the substrate.

The second electrically conducting ground plane may be arranged on, or at, the second face of the substrate. In a variant, the second electrically conducting ground plane could be arranged on another support than the second face of the substrate.

The first and second electrically conducting elements of the first and second high impedance surfaces may be arranged in a same second dielectric layer on which is arranged at least the first RF transmission electronic circuit.

The device may further comprise a printed circuit to which the substrate is joined and to which at least the first RF transmission electronic circuit is electrically connected.

Advantageously, the substrate may be mechanically and electrically connected to the printed circuit through the intermediary of a plurality of conducting heads, for example metallic, regularly spread out on the second face of the substrate.

A method for producing a RF transmission device is also described, including at least the steps of:
    forming, on a first face of a substrate, a first high impedance surface comprising at least several first electrically conducting elements forming a first periodic structure;
    transferring a first RF transmission electronic circuit onto and/or into the substrate;
    forming a first antenna arranged on the side of the first face of the substrate and opposite the first electrically conducting elements, spaced apart from the first face of the substrate and electrically connected to the first RF transmission electronic circuit;
    forming a first electrically conducting ground plane at least partially opposite the first antenna;
and in which the first high impedance surface and the first electrically conducting ground plane together form a first electromagnetic wave reflector coupled to the first antenna.

The method may further comprise the steps of:
    forming at least one second antenna arranged on the side of the first face of the substrate, spaced apart from the first face of the substrate and electrically connected to the first RF transmission electronic circuit or to a second RF transmission electronic circuit transferred onto and/or into the substrate;
    forming at least one second electromagnetic wave reflector coupled to the second antenna and including at least:
        a second high impedance surface comprising at least several second electrically conducting elements forming a second periodic structure and arranged on the first face of the substrate opposite the second antenna;
        a second electrically conducting ground plane arranged at least partially opposite the second antenna.

Advantageously, different applications may be envisaged such as:
    short range wireless communications (typically carried out at 60 GHz) such as for example very high speed communications of WiGig, WiHD, HDMI wireless type, etc.;
    networks of sensors;
    automobile radars (operating notably at frequencies of 24 GHz, 77 GHz, etc.);
    imaging and security (transmission of mmW and THz signals);
    millimetric avionic radars (transmission at 90 GHz);
    high speed wireless communications of 4G or 5G type (or LTE for "Long Term Evolution") and in localized cells ("small cells") or point to point connection ("backhauling").

BRIEF DESCRIPTION OF THE DRAWINGS

The present invention will be better understood on reading the description of examples of embodiment given purely for indicative purposes and in no way limiting and by referring to the appended drawings in which.

Identical, similar or equivalent parts of the different figures described hereafter bear the same numerical references so as to make it easier to go from one figure to the next.

The different parts shown in the figures are not necessarily according to a uniform scale, in order to make the figures more legible.

The different possibilities (variants and embodiments) must be understood as not being mutually exclusive and can be combined together.

DETAILED DESCRIPTION OF PARTICULAR EMBODIMENTS

Figure 1:
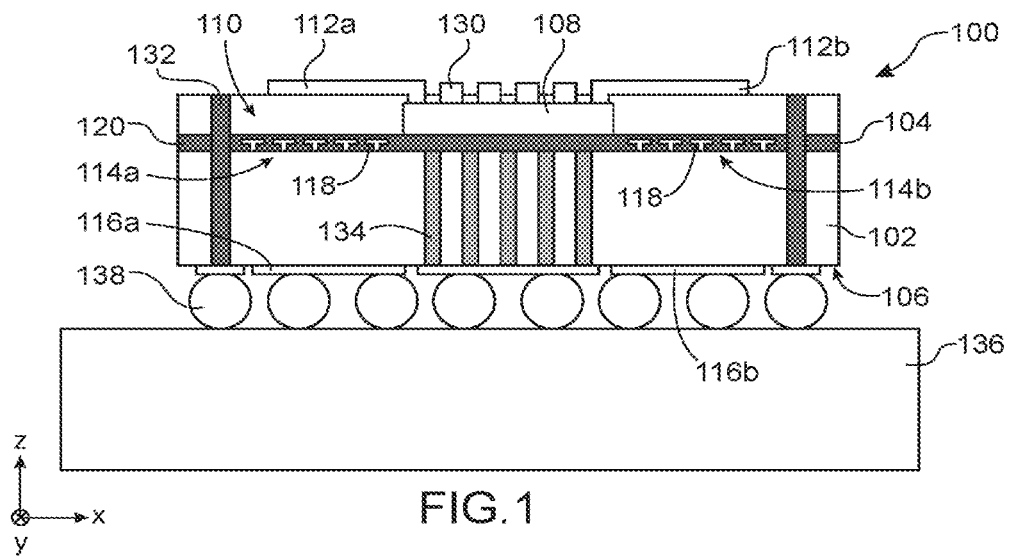
FIGS. 1 and 4 show a RF transmission device according to a first embodiment.

Reference is firstly made to FIG. 1 which shows a RF transmission device 100 according to a first embodiment. The device 100 is intended to transmit and/or receive RF signals of frequency for example comprised between around 1 GHz and 300 GHz, here equal to 60 GHz.

The device 100 comprises a substrate 102. The material of the substrate 102 is advantageously selected from materials which are poor electrical conductors (having a high resistivity, for example greater than around 1 kOhm·cm), good heat conductors (the heat conduction of which is preferably greater than around 10 W/K·m), very weakly dissipating in the range of wavelengths of the RF signals intended to be transmitted and/or received by the device 100, and which enable the implementation of methods for producing microconnectics of very good resolution (for example of dimensions less than around 1 µm) for the formation of routing lines, high impedance surfaces and antennas in a collective manner. Furthermore, said substrate 102 is preferably the least expensive possible. One of the materials fulfilling these criteria is for example silicon. The thickness of the substrate 102 is advantageously selected such that the substrate 102 is as thin as possible while being sufficiently rigid to be handled. This thickness is for example comprised between around 50 µm and 500 µm, advantageously comprised between around 200 µm and 300 µm (which is thinner than structures of the prior art, the thicknesses of which are typically comprised between around 500 µm and 2 mm).

The substrate 102 comprises a first face 104, here forming a front face of the substrate 102, and a second face 106 opposite to the first face 104 and here forming a rear face of the substrate 102.

The device 100 also comprises an electronic circuit for example in the form of RF transmission chip, or integrated circuit 108, arranged on the first face 104 of the substrate 102. The rear face of the circuit 108 is arranged on the side the substrate 102, and the active face of the circuit 108, i.e, that at which are located the inlet and outlet pads of the circuit 108, is located on the side opposite to the substrate 102. The circuit 108 has for example a thickness (dimension along the Z axis) comprised between around 10 µm and 300 µm, advantageously between around 50 µm and 100 µm. Such a thickness may be obtained thanks to an implementation of a thinning of the circuit 108. The circuit 108 may be maintained on the substrate 102 using a heat conducting adhesive or grease.

The circuit 108 is surrounded by a dielectric layer 110 formed on the first face 104 of the substrate 102 and the thickness of which is for example equal to or close to that of the circuit 108. It is possible that the thickness of the dielectric layer 110 is slightly greater (for example 10 µm to 50 µm more) than that of the circuit 108, the dielectric layer 110 coating, or covering, in this case the circuit 108. The thickness of the dielectric layer 110 is typically comprised between around 10 µm and 300 µm. The dielectric layer 110 comprises for example oxide, such as $SiO_2$, nitride, such as SiN, or preferentially a photosensitive polymer, such as SiNR, BCB, Intervia, etc.). The material of the dielectric layer 110 is advantageously selected from those which are very good insulators and which are weakly dissipating in the range of operating frequencies of the device 100. Furthermore, the permittivity and the permeability of the material of the dielectric layer 110 are preferably known in order to favor the performances of the antenna(s) 110 via the judicious choice of parameters of the high impedance surfaces described hereafter. Finally, the upper face of the dielectric layer 110 is advantageously flat thanks to the use of a material designated "planarizing", such as for example certain polymers, which make it possible to have a flat surface despite the thickness of the covered circuit 108, or instead thanks to a planarization (for example a CMP) implemented after the deposition of said dielectric material.

The circuit 108 is electrically connected to one or more antennas 112 arranged on the dielectric layer 110. In the example of FIG. 1, the device comprises two antennas 112a, 112b, one for transmitting RF signals and the other for receiving RF signals. The antennas 112a, 112b are for example formed by metal lines extending onto the dielectric layer 110, on the side of the circuit 108. The antennas 112a, 112b are for example of dipole type. The antennas 112a, 112b may be electrically connected to the circuit 108 notably by interconnection lines 130 extending onto the dielectric layer 110 and by conducting vias crossing through the dielectric material of the layer 110 covering the circuit 108. The conducting portions forming the antennas 112a, 112b as well as the electrical interconnection lines 130 connecting the antennas 112a, 112b to the circuit 108 may have a thickness comprised between around 0.5 µm and 10 µm.

The device 100 also comprises one or more electromagnetic wave reflectors, each associated with an antenna 112. Each electromagnetic wave reflector is formed:
of a high impedance surface 114 arranged on the first face 104 of the substrate 102, opposite the antenna 112 with which the electromagnetic wave reflector is associated, and between the substrate 102 and the dielectric layer 110, and
of an electrically conducting ground plane 116 arranged on the second face 106 of the substrate 102 and aligned (along the Z axis in FIG. 1) in view of the antenna 112 with which the electromagnetic wave reflector is associated (and thus also aligned with the high impedance surface 114 of the electromagnetic wave reflector).

In the example of FIG. 1, the antenna 112a is coupled to an electromagnetic wave reflector formed by the high impedance surface 114a and the ground plane 116a, and the antenna 112b is coupled to another electromagnetic wave reflector formed by the high impedance surface 114b and the ground plane 116b. In the example of FIG. 1, each of the ground planes 116 corresponds to a metal portion, comprising for example a titanium/copper bilayer, located opposite the corresponding antenna 112. In a variant, the ground planes 116 of the electromagnetic wave reflectors may be formed by a metal layer, or a stack of layers, not etched, covering the second face 106 of the substrate 102.

Each high impedance surface 114 comprises several electrically conducting elements 118, for example metallic, repeated in a periodic structure reflecting the electric field of the electromagnetic waves reaching the high impedance surface 114 and creating the phase conditions necessary so that the magnetic field of the waves is reflected thanks to the combination of the high impedance surface 114 and the associated ground plane 116. The electrically conducting elements 118 may be formed with metals generally used in microelectronics, such as for example copper, aluminum, titanium, etc.

The conducting elements 118 of a high impedance surface 114 form repeating geometric patterns and arranged next to each other with a certain period. Each geometric pattern is formed by at least one portion of electrically conducting material, for example of square, hexagonal shape, etc. Each geometric pattern may also be formed of several portions of flat electrically conducting material arranged next to each other in a same plane and/or arranged in several planes superimposed one above the other. Each geometric pattern may also comprise at least one vertical conducting portion connected to the or one of the other conducting portions of the geometric pattern.

The electrically conducting elements 118 of a high impedance surface 114 are advantageously arranged within a dielectric layer 120 comprising a material with very low conductivity and very low dissipation in the band of operating frequencies of the device 100, for example an oxide such as $SiO_2$ or a nitride. The dielectric layer 120 may also comprise a material of permeability µ' (magnetic property) for example of value comprised between around 1 and 50, for example insulating ferrite, making it possible to concentrate the magnetic field lines and to reinforce the electromagnetic effect of the high impedance surfaces. The layer 120 may correspond to a stack of several dielectric layers.

The high impedance surfaces 114 have a special electromagnetic behavior in a certain band of frequencies. The periodic structures of the surfaces 114 may have spatial periodicity and are considered as homogeneous with respect to the wavelength at the transmission frequency for which they are designed. Each high impedance surface 114 associated with a ground plane 116 thus behaves like a reflective, or resonant, cavity, $\lambda/4$ coupled to a "conventional" reflective plane (simple metal plane) for the antenna, from an electromagnetic viewpoint, but significantly improves its performances (gain and directivity notably) with much smaller thicknesses ($\lambda/10$ to $\lambda/20$) in view of the wavelength.

In the example of FIG. 1, the high impedance surfaces 114a, 114b comprise a dielectric layer 120 which is common to the high impedance surfaces 114a, 114b and in which are arranged the conducting elements 118 of the high impedance surfaces 114a, 114b.

The high impedance surface(s) 114 of the device 100 preferentially have a very reduced thickness, for example comprised between around 500 nm and 5 µm, compared to that of the substrate 102 which is for example comprised between around 50 µm and 500 µm. The thickness of each periodic pattern formed by the electrically conducting elements 118 is for example comprised between around 50 µm and 1 µm, for example equal to around 500 nm. The thickness of the dielectric layer 120 is for example comprised between around 100 nm and 5 µm.

The parameters of the elements forming the high impedance surfaces 114 (height of the electrically conducting elements 118, thickness of the dielectric layer 120, number and shape of the patterns of the periodic structure, etc.) are selected in a precise manner while taking into account the overall architecture of the device 100, and notably in considering the thickness of the substrate 102, the distance between the antennas 112 and the associated high impedance surfaces 114, the materials used, the properties of the antennas 112, the operating frequencies of the device 100, etc. This is done via the use of electromagnetic simulation software such as for example HFSS software distributed by the firm Ansys, or Momentum software distributed by the firm Keysight. The dimensions of the patterns and the spaces separating them must be very well defined in the final module because at high frequencies, for example above 60 GHz, the characteristic dimensions of the patterns and the spaces between them may be less than several microns.

Figure 2:
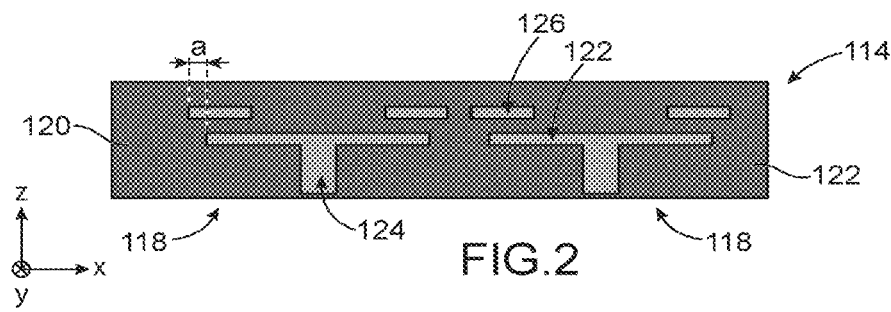
FIGS. 2 and 3 show an example of embodiment of electrically conducting elements of a high impedance surface of a RF transmission device.

FIG. 2 shows a profile view of two electrically conducting elements 118 of a high impedance surface 114 intended to be coupled to an antenna 112 carrying out a transmission of waves.

Figure 3:
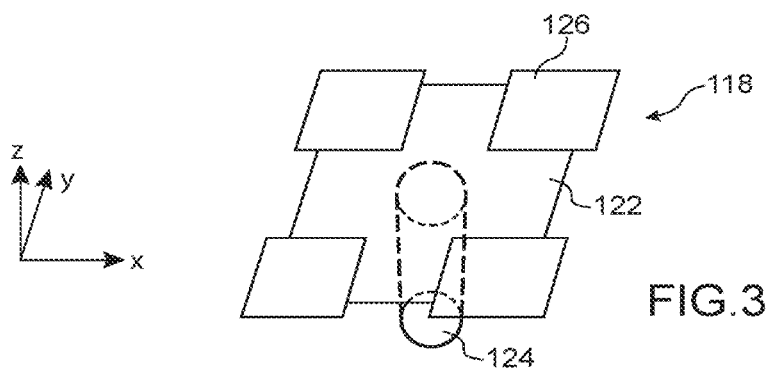

FIG. 3 shows a three-dimensional view of one of these electrically conducting elements 118.

Each element 118 comprises a first conducting portion 122, flat and of square section, each side of which is for example equal to around 175 µm, to which a second vertical conducting portion 124 of cylindrical shape, for example of diameter equal to around 60 µm and of height equal to around 3 µm, may be connected. Each element 118 also comprises four third conducting portions 126, flat and of square section, of dimensions less than those of the first conducting portion 122. Each of the third conducting portions 126 has, advantageously, lateral dimensions around four times smaller than those of the first portion 122, i.e. for example a side equal to around 45 µm, and each arranged opposite one of the corners of the first conducting portion 122. Each of the third conducting portions 126 is shifted with respect to one of the corners of the first conducting portion 122 by a distance "a" for example equal to 10 µm. The third conducting portions 126 are arranged above the first conducting portion 122 and are separated from the first conducting portion 122 by the dielectric material of the layer 120. When the first portion 122 has a thickness equal to around 1 µm, the height between the first portion 122 and the third portions 126 is for example equal to around 6 µm.

The conducting portions of the elements 118 here comprise copper, and the dielectric layer 120 corresponds to a layer of $SiO_2$.

Examples of dimensions and materials are given below for a device 100 transmitting signals of frequency equal to around 60 GHz:

substrate 102 comprising high resistivity silicon (resistivity above 1 kOhm·cm, permittivity equal to 11.9) and a thickness equal to around 200 µm;

high impedance surfaces 114 comprising elements 118 formed from a metal layer made of copper of thickness equal to around 500 nm, of square pattern of side equal to around 200 µm, arranged next to each other in a same horizontal plane and spaced apart by a distance equal to around 20 µm;

dielectric layer 110 comprising a passivation polymer of ALX or BCB type and of thickness equal to around 12 µm;

antennas 112 and electrical interconnections 130 formed from a layer of copper or gold of thickness equal to around 1 µm, the antennas 112 being of folded dipole type, ground planes 116 formed of a Ti/copper bilayer of thickness equal to around 500 nm.

In the aforementioned conditions, the simulation and technological production of a transmission device are in agreement and demonstrate properties of antennas as good as (gain of at least +5 dBi, pass band of around 10-15%) or even better than a transmission device which would comprise, instead of an electromagnetic wave reflector as described previously, a conventional antenna coupled to a reflector formed of a simple metal layer spaced apart from the antenna by a distance equal to $\lambda/4$, i.e. 1.25 mm, which is much bulkier than the thickness of the device 100 described previously.

With the aim of improving the compactness and the heat dissipation of the circuit 108, it is possible to form conducting through vias, for example metallic, in the substrate 102. These vias may have several functions:

they make it possible to make electrical connections emerge on the periphery of the device 100, at the rear face of the substrate 102, and thus make it possible to realize a beading of electrical connections after routing on the rear face of the substrate 102;

they make it possible to form a guard ring around each antenna 112, thereby isolating the antennas 112 from each other while considerably reducing cross talk there between;

vias placed directly under the circuit 108 actively participate in the dissipation of heat generated in the circuit 108 thanks to the high heat conductivity of the metal (for example, the thermal conductivity of copper is around 400 W/K·m whereas that of silicon is 150 W/K·m and that of an organic substrate is less than around 1 W/K·m). These heat dissipation vias arranged under the circuit 108 are not necessarily electrically connected to the circuit 108.

These different through vias may be isolated or not from the substrate 102, for example by forming a thin dielectric layer between the conducting material of the via and the semi-conductor of the substrate 102, to avoid losses or interferences.

Figure 4:
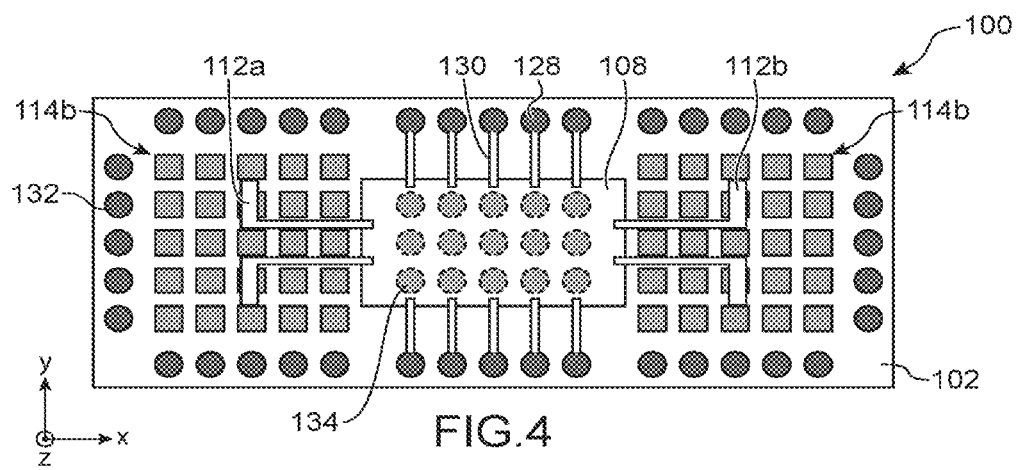

FIG. 4 is a schematic top view of the device 100 on which the different types of conducting vias formed in the substrate 102 are shown.

First conducting vias 128 are formed on the periphery of the substrate 102 and are electrically connected to the circuit 108 by electrical interconnections 130 (for example formed from the same metal layer serving for the production of the antennas 112). These first vias 128 emerge at the rear face of the substrate 102, cross through the substrate 102 and the dielectric layers 120 and 110 emerge at the top of the dielectric layer 110, on the side of the circuit 108.

Second conducting vias 132 are formed on the periphery of the substrate 102, around antennas 112 thereby forming guard rings. In the example described here, these second conducting vias 132 are not electrically connected to the circuit 108. The second conducting vias 132 emerge at the rear face of the substrate 102, cross through the substrate 102 and the dielectric layers 120 and 110 emerge at the top of the dielectric layer 110.

Third conducting vias 134 cross through only the substrate 102 and the dielectric layer 120 and are arranged under the circuit 108 and make it possible to dissipate heat produced by the circuit 108.

The rear face 106 of the substrate 102 is covered at least partially by an electrically conducting layer or electrically conducting portions which form notably the ground planes 116, but also conducting supports making it possible to assemble the substrate 102 on a printed circuit 136 (PCB) via beads 138, or microbeads, formed from a brazing material. Due to the fact that the ground planes 116 are arranged directly against the rear face 106 of the substrate 102, it is possible to cover entirely the rear face of the substrate 102 by beads 138. In view of the large dimensions of the device 100 in the case of multiple antennas (around 15×15 mm² or even more), this homogeneous distribution of beads 138 on all the rear face 106 of the substrate 102 assures very good connection reliability between the substrate and the printed circuit 136. Moreover, some of the beads 138 assure the electrical connections between the circuit 108 (through the intermediary of first vias 128) and the printed circuit 136. In a variant, it is possible that the third vias 134 are electrically connected to the circuit 108 at its rear face, and thereby assure one or more electrical connections between the circuit 108 and the printed circuit 136.

Means of mechanical and electrical connection other than beads 138 may be used.

In a variant of this assembly produced by the beads 138, the substrate 102 may be bonded directly onto the printed circuit 136, and the electrical connections between the circuit 108 and the printed circuit 136 are then formed by electric wires ("wire bonding") connected to the front face of the circuit 108 and to the printed circuit 136.

The device 100 may be produced via the implementation of conventional micro-manufacturing techniques used in micro-electronics, with a relatively moderate number of steps, and thus at low cost. An example of a method of producing the device 100 is described below.

The method is implemented from the substrate 102.

The electrically conducting elements 118 of the high impedance surfaces 114 are formed by metallic depositions, photolithography and etching. The dielectric layer 120 is formed by successive depositions of dielectric material implemented during the formation of the different conducting portions of the elements 118.

The circuit 108 is then transferred onto the dielectric layer 120. A thinning of the circuit 108 may be implemented prior to transfer which may be carried out by a "flip chip" transfer machine (for example of the type "Datacon 2200+" commercialized by the firm Besi). The circuit 108 may be maintained on the substrate 108 using a heat conducting adhesive or grease.

A dielectric material is then deposited by spin coating, spray coating or lamination, according to the nature of the material, notably around the circuit 108 and on the dielectric layer 120, thereby forming the dielectric layer 110. The upper face of the dielectric layer 110 is here flat thanks to the use of a dielectric material known as "planarizing", or via the implementation of a planarization of the dielectric material deposited.

Following the deposition of the dielectric material, electrical contact pick-ups are potentially formed through the dielectric material of the layer 110 covering the circuit 108, at the contact pads of the circuit 108. These contact pick-ups may be formed either by photolithography if the material of the dielectric layer 110 is photosensitive, or by traditional lithography and etching, or by laser etching. The conducting interconnection lines 130 and the antennas 112 are then formed on said dielectric layer 110, connected to contact pads of the circuit 108.

The substrate 102 may potentially be thinned from its rear face 106, to its final thickness (for example comprised between around 50 μm and 500 μm). A metal layer is then deposited on the rear face 106 of the substrate 102 to form the ground planes 116, this layer being able to be structured or not.

The conducting vias 128, 132 and 134 are then formed via conventional techniques: photolithography, deep etching or laser piercing, and filling by conducting materials (copper, aluminum, etc.).

In a variant, it is possible that said vias are formed prior to the high impedance surface 118 from the front face of the substrate 102. These vias are then revealed at the rear face of the substrate 102 after thinning of the substrate 102.

The assembly is then joined and electrically connected to the printed circuit 136.

The device 100 described previously comprises a single circuit 108 assuring the transmission and the reception of signals at a same frequency (for example 60 GHz) via two antennas 112*a*, 112*b* each coupled to an electromagnetic wave reflector comprising a high impedance surface 114*a*, 114*b* and a ground plane 116*a*, 116*b*.

Figure 5:
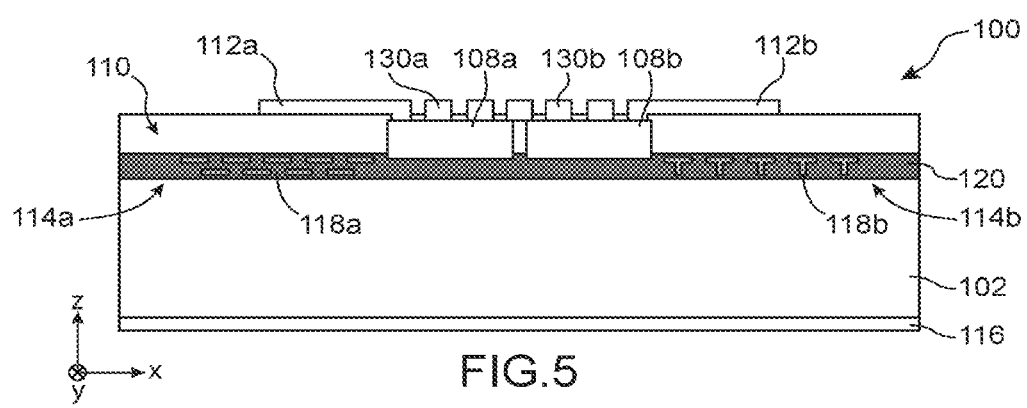
FIGS. 5 and 6 show a part of a RE transmission device according to a second embodiment.
Figure 6:
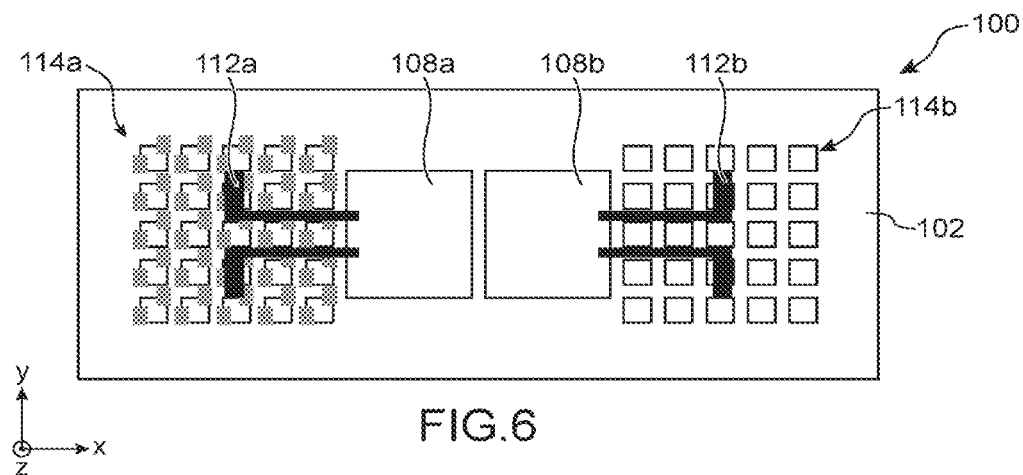

In a second embodiment, it is possible that the device 100 carries out a transmission and a reception of signals at frequencies different from each other. An example of device 100 according to this second embodiment is shown in FIGS. 5 and 6. In these figures, the different conducting vias crossing through the substrate 102 and corresponding to the vias 128, 132 and 134 described previously are not shown.

The device 100 according to this second embodiment integrates several antennas 112 (two antennas 112*a*, 112*b* in the example described here) intended to transmit/receive signals of frequencies different to each other. In the example described here, the first antenna 112*a* is capable of carrying out a transmission and a reception of signals of frequency equal to 60 GHz, and the second antenna 112*b* is capable of carrying out a transmission and a reception of signals of frequency equal to 80 GHz. Furthermore, each of these antennas 112*a*, 112*b* is connected to a specific circuit 108*a*, 108*b* which is associated therewith. In a variant, the device 100 could only comprise a single circuit 108 capable of managing transmissions according to different frequencies.

In this second embodiment, the substrate 102 and the dielectric layer 110 may have the same thickness as for the device 100 according to the first embodiment. The circuits 108a, 108b here have substantially equal thicknesses (to within 10%) and are transferred in an identical manner (rear face flip-chip on the substrate 102).

Given that the transmission frequencies for the two antennas 112a, 112b are different, the high impedance surfaces 114a, 114b coupled to these antennas 112a, 112b are formed by electrically conducting elements 118a, 118b different from one surface to the next and forming different periodic structures for these two high impedance surfaces 114a, 114b. Advantageously, the optimization of the respective electromagnetic performances of each antenna 112a, 112b is achieved uniquely by an optimization of the designs of the patterns of the electrically conducting elements 118a, 118b in a same dielectric material, for example a polymer of ALX type forming the layer 120. By optimizing their shape, size, number and distribution, it is possible to form two high impedance surfaces conferring to the two antennas good performances at different frequencies on a substrate 102 of same thickness.

If needs be, the dielectric of the layers 110 and/or 120 may be potentially different under the two antennas 112a, 112b with the aim of improving in an independent manner and in a significant manner the electromagnetic properties of each of the high impedance surfaces 114a, 114b. This nevertheless has the consequence of making the method of producing the device 100 more complex because it is necessary to form the two different high impedance surfaces 114a, 114b in two stages.

Finally, the ground planes 116 associated with each antenna 112a, 112b are formed by a same metal layer 116, not structured and of substantially constant thickness, deposited on the whole of the rear face 106 of the substrate 102. In a variant, ground planes 116a, 116b formed by separate portions could be formed.

The device 100 according to this second embodiment may comprise more than two circuits 108 and/or antennas 112 of different frequencies.

In a variant of the two embodiments described previously, it is possible that the dielectric layer 110 and the dielectric layer 120 are etched in order to eliminate the parts of said layers not located opposite the antennas 112. This makes it possible notably to limit the stresses induced on the substrate 102 and to be able to pick up the electrical contacts by making the conducting lines pass on the sides of said dielectric layers. This can be done easily if the dielectric is a photosensitive polymer, or then by conventional techniques of photolithography and etching.

Figure 7:
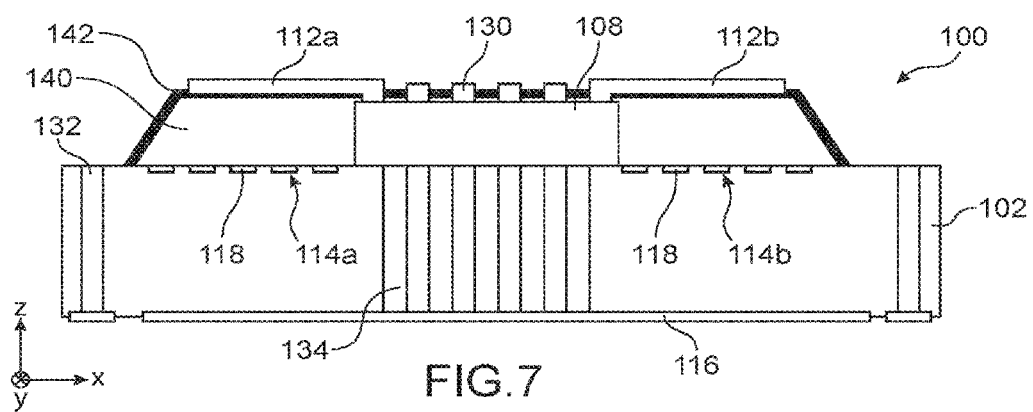
FIG. 7 shows a part of a RF transmission device according to a variant of the first embodiment.

FIG. 7 shows the device 100 according to a variant of the first embodiment.

In this variant, the dielectric layer 110 is replaced by a cavity 140 formed between the high impedance surfaces 114a, 114b and a suspended membrane 142 on which are formed the antennas 112a, 112b and the electrical interconnection lines 130. The suspended membrane is formed by a dielectric layer of thickness for example comprised between around 1 μm and 5 μm. The cavity 140 comprises lateral walls formed by first parts of this dielectric layer, and an upper wall formed by a second part of the dielectric layer at which are located the antennas 112a, 112b and the electrical interconnection lines 130, The height, or the thickness, of the cavity 140 is for example equal to the thickness of the dielectric layer 110, The cavity 140 is filled with air.

This variant in which the dielectric layer 110 is replaced by the cavity 140 may apply also to the second embodiment.

The invention claimed is:

1. RF transmission device including at least:
   a substrate comprising first and second faces opposite to each other;
   a first RF transmission electronic circuit arranged on and/or in the substrate;
   a first antenna arranged on the side of the first face of the substrate, spaced apart from the first face of the substrate and electrically connected to the first RF transmission electronic circuit;
   a first electromagnetic wave reflector coupled to the first antenna and including at least:
      a first high impedance surface comprising at least several first electrically conducting elements forming a first periodic structure and arranged on the first face of the substrate opposite the first antenna;
      a first electrically conducting ground plane arranged at least partially opposite the first antenna.

2. Device according to claim 1, in which the first RF transmission electronic circuit is arranged at the first face of the substrate.

3. Device according to claim 1, in which the first electrically conducting ground plane is arranged on the second face of the substrate.

4. Device according to claim 1, further comprising a first dielectric layer arranged on the first face of the substrate, surrounding the first RF transmission electronic circuit and on which the first antenna is arranged.

5. Device according to claim 1, further comprising a cavity delimited by the first high impedance surface and by a suspended membrane on which at least the first antenna is arranged.

6. Device according to claim 1, in which a distance between the first antenna and the first electrically conducting ground plane is less than or equal to around a tenth of a central wavelength of first RF signals intended to be transmitted and/or received by the first antenna.

7. Device according to claim 1, in which each first electrically conducting element of the first high impedance surface comprises one or more flat conducting portions arranged beside each other and/or in different planes superimposed on each other, the first high impedance surface further comprising a second dielectric layer in which are arranged the first electrically conducting elements.

8. Device according to claim 7, in which each first electrically conducting element of the first high impedance surface further comprises at least one vertical conducting portion connected to the or at least to one of the flat conducting portions of said first electrically conducting element.

9. Device according to claim 1, further comprising:
   several first electrically conducting vias crossing through at least the substrate and electrically connected to the first RF transmission electronic circuit, and/or
   several second electrically conducting vias crossing through at least the substrate and arranged around the first antenna while forming a guard ring around the first antenna, and/or
   several third heat conducting vias crossing through at least the substrate and arranged under the first RF transmission circuit.

10. Device according to claim 9, in which the third heat conducting vias are electrically conducting.

11. Device according to claim 1, further comprising at least:
- a second antenna arranged on the side of the first face of the substrate, spaced apart from the first face of the substrate and electrically connected to the first RF transmission electronic circuit;
- a second electromagnetic wave reflector coupled to the second antenna and including at least:
  - a second high impedance surface comprising at least several second electrically conducting elements forming a second periodic structure and arranged on the first face of the substrate opposite the second antenna;
  - a second electrically conducting ground plane arranged at least partially opposite the second antenna.

12. Device according to claim 1, further comprising at least:
- a second RF transmission electronic circuit arranged on and/or in the substrate;
- a second antenna arranged on the side of the first face of the substrate, spaced apart from the first face of the substrate and electrically connected to the second RF transmission electronic circuit;
- a second electromagnetic wave reflector coupled to the second antenna and including at least:
  - a second high impedance surface comprising at least several second electrically conducting elements forming a second periodic structure and arranged on the first face of the substrate opposite the second antenna;
  - a second electrically conducting ground plane arranged at least partially opposite the second antenna.

13. Device according to claim 11, in which the second electrically conducting ground plane is arranged on the second face of the substrate.

14. Device according to claim 12, in which the second electrically conducting ground plane is arranged on the second face of the substrate.

15. Device according to claim 11, in which the first and second electrically conducting elements of the first and second high impedance surfaces are arranged in a same second dielectric layer on which is arranged at least the first RF transmission electronic circuit.

16. Device according to claim 12, in which the first and second electrically conducting elements of the first and second high impedance surfaces are arranged in a same second dielectric layer on which is arranged at least the first RF transmission electronic circuit.

17. Device according to claim 1, further comprising a printed circuit to which the substrate is joined and to which at least the first RF transmission electronic circuit is electrically connected.

18. Device according to claim 17, in which the substrate is connected mechanically and electrically to the printed circuit through the intermediary of a plurality of conducting beads regularly spread out on the second face of the substrate.

19. Method for producing a RF transmission device, including at least the steps of:
- forming, on a first face of a substrate, a first high impedance surface comprising at least several first electrically conducting elements forming a first periodic structure;
- transferring a first RF transmission electronic circuit onto and/or into the substrate;
- forming a first antenna arranged on the side of the first face of the substrate and opposite the first electrically conducting elements, spaced apart from the first face of the substrate and electrically connected to the first RF transmission electronic circuit;
- forming a first electrically conducting ground plane at least partially opposite the first antenna;
- and in which the first high impedance surface and the first electrically conducting ground plane together form a first electromagnetic wave reflector coupled to the first antenna.

20. Method according to claim 19, further comprising the steps of:
- forming at least one second antenna arranged on the side of the first face of the substrate, spaced apart from the first face of the substrate and electrically connected to the first RF transmission electronic circuit or to a second RF transmission electronic circuit transferred onto and/or into the substrate;
- forming at least one second electromagnetic wave reflector coupled to the second antenna and including at least:
  - a second high impedance surface comprising at least several second electrically conducting elements forming a second periodic structure and arranged on the first face of the substrate opposite the second antenna;
  - a second electrically conducting ground plane arranged at least partially opposite the second antenna.

* * * * *